(12) United States Patent
Colgan et al.

(10) Patent No.: US 7,344,907 B2
(45) Date of Patent: Mar. 18, 2008

(54) APPARATUS AND METHODS FOR ENCAPSULATING MICROELECTROMECHANICAL (MEM) DEVICES ON A WAFER SCALE

(75) Inventors: Evan G. Colgan, Chestnut Ridge, NY (US); Bruce K. Furman, Poughquag, NY (US); Christopher V. Jahnes, Upper Saddle River, NJ (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/993,548

(22) Filed: Nov. 19, 2004

(65) Prior Publication Data

US 2006/0108675 A1  May 25, 2006

(51) Int. Cl.
*H01L 21/00* (2006.01)
(52) U.S. Cl. .................. 438/51; 257/415; 257/E21.002
(58) Field of Classification Search .................. 438/51; 257/415, E21.002
See application file for complete search history.

(56) References Cited

U.S. PATENT DOCUMENTS

| | | | |
|---|---|---|---|
| 6,052,287 A | * | 4/2000 | Palmer et al. .............. 361/767 |
| 6,884,650 B2 | * | 4/2005 | Lee et al. ...................... 438/51 |
| 6,930,367 B2 | * | 8/2005 | Lutz et al. .................. 257/417 |
| 6,936,494 B2 | * | 8/2005 | Cheung ........................ 438/55 |
| 2001/0004085 A1 | * | 6/2001 | Gueissaz ................. 228/124.6 |
| 2001/0013653 A1 | * | 8/2001 | Shoji .......................... 257/738 |
| 2003/0001251 A1 | * | 1/2003 | Cheever et al. ............. 257/685 |
| 2005/0082654 A1 | * | 4/2005 | Humpston et al. .......... 257/678 |
| 2005/0167795 A1 | * | 8/2005 | Higashi ...................... 257/678 |

* cited by examiner

*Primary Examiner*—B. William Baumeister
*Assistant Examiner*—Steven J. Fulk
(74) *Attorney, Agent, or Firm*—F. Chau & Associates, LLC; Robert M. Trepp

(57) ABSTRACT

Apparatus and methods are provided for enabling wafer-scale encapsulation of microelectromechanical (MEM) devices (e.g., resonators, filters) to protect the MEMs from the ambient and to provide either a controlled ambient or a reduced pressure. In particular, methods for wafer-scale encapsulation of MEM devices are provided, which enable encapsulation of MEM devices under desired ambient conditions that are not determined by the deposition conditions of a sealing process in which MEM release via holes are sealed or pinched-off, and which prevent sealing material from being inadvertently deposited on the MEM device during the sealing process.

13 Claims, 4 Drawing Sheets

APPARATUS AND METHODS FOR ENCAPSULATING MICROELECTROMECHANICAL (MEM) DEVICES ON A WAFER SCALE

TECHNICAL FIELD OF THE INVENTION

The present invention relates generally to apparatus and methods for providing wafer-scale encapsulation of microelectromechanical (MEM) devices (e.g., resonators, filters) to protect the MEMs from the ambient and to provide either a controlled ambient or a reduced pressure. More specifically, the invention relates to methods for wafer-scale encapsulation of MEM devices, which enable wafer-scale encapsulation of MEM devices under desired ambient conditions that are not determined by the deposition conditions of a sealing process in which MEM release via holes are sealed or pinched-off, and which prevent sealing material from being inadvertently deposited on the MEM device during the sealing process.

BACKGROUND

Microelectromechanical system (MEMS) devices have the potential for great impact on the communications industry. MEMS RF switches, oscillators (resonators), filters, varactors, and inductors are a few of the devices that could replace large and relatively expensive off-chip passive components. It is even possible that the introduction of these types of MEMS devices, particularly resonators and filters, into analog and mixed-signal integrated circuits could dramatically alter the architecture of current wireless communication devices. Key to such advancements is the ability to monolithically integrate MEMS RF components with integrated circuit technologies to realize cost, size, power, and performance benefits.

A significant portion of the cost of MEM devices can be in the packaging, which can account for more than half of the total product cost for MEM devices. MEM devices typically have moving micro parts which must be protected from small particles. It is therefore desirable to package the MEM devices at wafer scale, prior to dicing the parts which creates many fine particles. To achieve high reliability operation of MEM devices such as switches, such devices must be hermetically sealed with an inert gas. For other MEM devices such as resonators, vacuum packaging is required to prevent reduction in the resonance quality factor by air damping.

A number of approaches have been proposed for MEM device encapsulation, where the most common methods involve bonding a second substrate over the MEM device to form a sealed cavity. For example, a hermetic seal can be formed by metal bonding a thin silicon wafer containing vertical electrical feed-through to the MEM device (see Y-K. Park et al., *Innovation ultra thin packaging for RF-MEMs Devices*, The 12th Int. Conf. on Solid State Sensors, Actuators and Microsystems, Boston, Jun. 8-12, 2003 pp. 903-906). In addition, K. Totsu et al., *Vacuum sealed ultra miniature fiber-optic pressure sensor using white light interferometry*, The 12th Int. Conf. on Solid State Sensors, Actuators and Microsystems, Boston, Jun. 8-12, 2003 pp. 931-934, describes the formation of a Fabry-Perot cavity between the end of an optical fiber and a silicon dioxide membrane sealed in vacuum using a solder. Moreover, D. Briand et al., *Metal to glass anodic bonding for Microsystems packaging*, The 12th Int. Conf. on Solid State Sensors, Actuators and Microsystems, Boston, Jun. 8-12, 2003 pp. 1824-1827, describes the anodic bonding of metal sheets, such as Invar, Kovar, and Alloy 42, to Pyrex for packaging micro-fluidic systems. In addition, T. Itoh et al., *Room temperature vacuum sealing using surface activated bonding method*, The 12th Int. Conf. on Solid State Sensors, Actuators and Microsystems, Boston, Jun. 8-12, 2003 pp. 1828-1831, describes surface activated bonding between Si/Si and Si/Cu surfaces. However, when an MEM device is integrated with an integrated circuit, the above methods are not compatible with designs intended for flip-chip packaging (i.e. C4 mini solder balls) and assume that the MEM resonator or filter is exposed on the top surface of the chip.

Another encapsulation method which has been proposed uses surface micro machining to form a local cavity over the MEM device. With the approach, sacrificial and capping layers are formed over the device, small etch holes are opened in the cap layer, the sacrificial layer is etched away, and then the holes are filled by growth or deposition of additional blanket films. Typically, these holes are subsequently pinched-off using a plasma deposition process. This approach offers a simple low cost means of encapsulation but with some risk of MEM device impairment by undesired deposition of material on the active device during pinch-off processing. This method is also limited to pressures of a few Torr or more in the sealed structure (i.e. the pressure at which the plasma deposition takes place) if a PECVD or CVD technique are used to perform the sealing operation.

For example, H. Stahl et al., *Thin film encapsulation of acceleration sensors using polysilicon sacrificial layers*, The 12th Int. Conf. on Solid State Sensors, Actuators and Microsystems, Boston, Jun. 8-12, 2003 pp. 1899-1902, describes the use of a poly silicon sacrificial layer and a polysilicon cap layer. The poly silicon sacrificial layer is etched using $ClF_3$ or $XeF_2$ and the vent holes are sealed by depositing a non-conformal PECVD oxide. Note that the ambient conditions of the device are determined by the sealing process used and the PECVD oxide can be inadvertently deposited on the active device. In addition, W-T. Park et al., *Wafer-scale film encapsulation of micromachined accelerometers*, The 12th Int. Conf. on Solid State Sensors, Actuators and Microsystems, Boston, Jun. 8-12, 2003 pp. 1903-1906, describes the use of a silicon dioxide sacrificial layer and an epitaxial polysilicon cap layer. The sacrificial layer is etched using vapor HF and the vent holes are sealed by depositing a non-conformal low temperature oxide layer. Again, with such method, the ambient conditions of the device are determined by the deposition conditions of the sealing process used and, the sealing material can be inadvertently deposited on the active device.

U.S. Patent Application publication No. US2002/0197761 A1, published Dec. 26, 2002, describes methods for releasing an MEM structure and describes a number of packaging methods which can be used including wafer bonding using anodic bonding, metal eutectic bonding, fusion bonding, epoxy bonding or other bonding processes where the preferred bonding method is using IR or UV epoxy. Also described is dispensing an epoxy, polymer, or other adhesive in a gasket region. Moreover, U.S. Patent Application publication No. US2003/0138986 A1, published Jul. 24, 2003, describes encapsulating release structures where access holes or trenches can be sealed by any number of methods including sputtering, CVD, PECVD, or spin on glass methods. The access trenches can be sealed with any number of materials including metals, polymers and ceramics. Preferably, they are sealed by sputtering a layer of Al over the access trenches and capping layer. As noted above, a disadvantage of these methods of sealing the access holes is that the ambient conditions of the device are determined by the deposition conditions of the sealing process used.

From a general perspective, a variety of thin film processing techniques, or combinations thereof, can be used to seal small vent holes. Vacuum evaporation of materials is generally the lowest pressure deposition process and may be the most effective technique to obtain a low pressure seal. However, evaporation processes result in a line of sight coverage and films would have to be deposited in a special configuration to preferentially deposit the film on the vent side wall to promote closing of the vent hole. Additionally, any MEM component exposed to the evaporative flux will receive a significant deposition of material that can alter the performance of the MEM device. For example, adding mass to a micro mechanical resonator (or beam) will change the operational frequency of the resonator or cause stress related distortions of the beam. By way of further example, an MEM switch device could be rendered inoperative if coatings get onto the switch contact and cause shorts or opens. High pressure thin film processes, CVD, PECVD, and LPCVD as examples, typically work best for sealing a vent hole and providing the least amount of material coatings within the cavity. The drawbacks of these techniques are the high pressure they would seal in the cavity and because they are generally performed at high temperatures (>200 degrees C.) all surfaces within the cavity are prone to some coating from the gaseous precursor, albeit perhaps a very thin coating.

An intermediate pressure process is sputter deposition. With most sputtering processes, a minimal pressure of about 1 mT of an inert gas, typically argon, is needed to establish a plasma for sputtering. This represents the nominal minimal pressure obtainable. As a result common thin film deposition processes applied to seal small vent holes is limited by both the attainable vacuum level and the potential for detrimentally coating the MEM devices.

SUMMARY OF THE INVENTION

Exemplary embodiments of the invention generally include apparatus and methods for providing wafer-scale encapsulation of microelectromechanical (MEM) devices (e.g., resonators, filters) to protect the MEMs from the ambient and to provide either a controlled ambient or a reduced pressure. In particular, exemplary embodiments of the invention include methods for wafer-scale encapsulation of MEM devices, which enable wafer-scale encapsulation of MEM devices under desired ambient conditions that are not determined by the deposition conditions of a sealing process in which MEM release via holes are sealed or pinched-off (e.g., pressures less than a few mT are possible), and which prevent sealing material from being inadvertently deposited on the MEM device during the sealing process.

More specifically, in one exemplary embodiment of the invention, a method for sealing a microelectromechanical (MEM) device includes forming a semiconductor device wafer having an MEM device formed in a cavity within the device wafer and a plurality of via holes extending from a surface of the semiconductor device wafer to the cavity, and then sealing the via holes under controlled ambient conditions within the cavity, wherein sealing is performed under conditions that are independent of the deposition conditions of the sealing material.

For example, in one exemplary embodiment of the invention, a reflowable sealing material is deposited around the via holes used to release an MEM device within the cavity in which the MEM device operates, and the sealing material is subsequently reflowed in vacuum, or a controlled ambient, to seal the holes. More specifically, a process of sealing the via holes includes depositing a reflowable sealing material on a surface of the semiconductor device wafer in proximity to the via holes, placing the semiconductor device wafer in an environment with the controlled ambient conditions (e.g., a vacuum), and melting the reflowable sealing material to seal the via holes while the semiconductor device wafer is subjected to the controlled ambient conditions.

In another exemplary embodiment of the invention, a carrier wafer, or other substrate, can be used to transfer reflowable sealing material for sealing MEM release via holes in a desired ambient, e.g., vacuum etc. More specifically, in one exemplary embodiment of the invention, a method for sealing a microelectromechanical (MEM) device includes forming a semiconductor device wafer having an MEM device formed in a cavity within the device wafer and a plurality of via holes extending from a surface of the semiconductor wafer device wafer to the cavity, and then sealing the via holes under controlled ambient conditions within the cavity, wherein sealing the via holes comprises depositing a reflowable sealing material on a surface of a carrier substrate, placing the semiconductor device wafer and carrier substrate in an environment with the controlled ambient conditions, and melting the reflowable sealing material to transfer the reflowable sealing material from the carrier substrate to the surface of the semiconductor device wafer to seal the via holes while the semiconductor device wafer is subjected to the controlled ambient conditions.

In exemplary embodiments of the invention, the types of reflowable sealing materials that may be used include, but are not limited to, solders, glass frits, or polymers, or other suitable reflowable sealing materials having low melting points.

These and other exemplary embodiments, aspects, features, and advantages of the present invention will become apparent from the following detailed description of exemplary embodiments, which is to be read in connection with the accompanying drawings.

DETAILED DESCRIPTION OF EXEMPLARY EMBODIMENTS

Figure 1A:
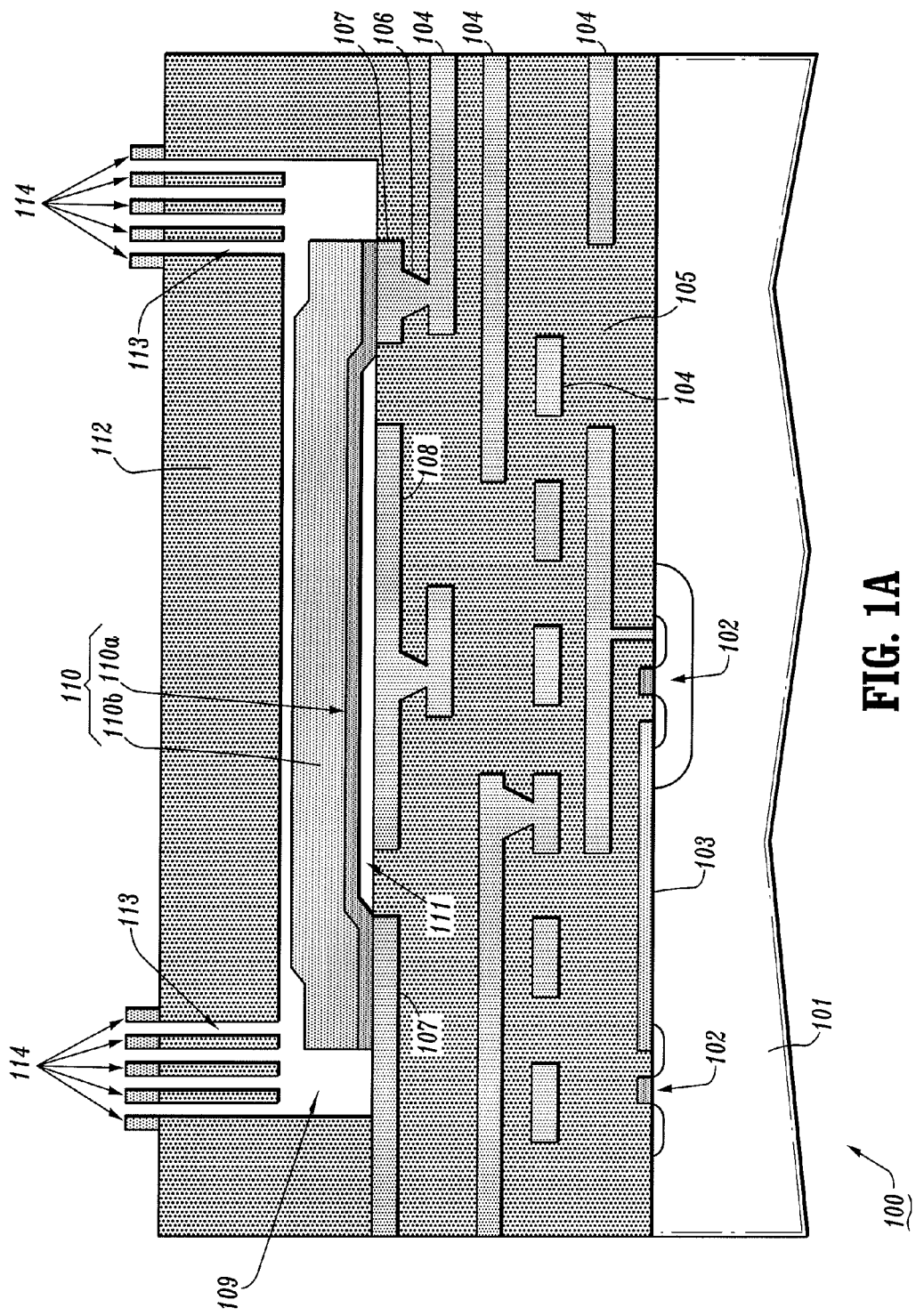
FIGS. 1A and 1B are schematic cross-sectional views of a MEM device, which illustrate a method for wafer-scale encapsulation of the MEM device according to an exemplary embodiment of the invention.
Figure 1B:
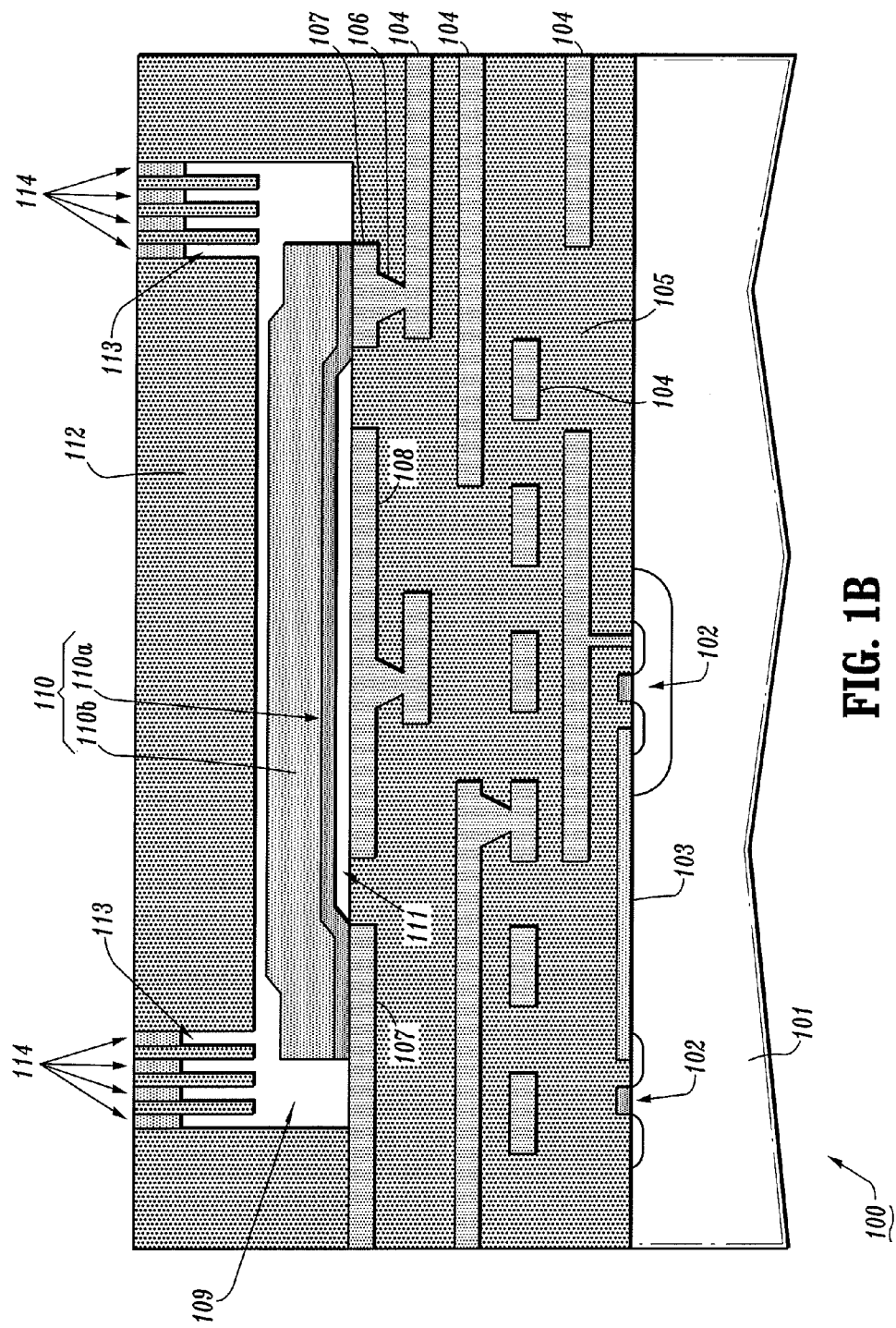

FIGS. 1A and 1B are schematic cross-sectional views of a semiconductor device (100) (e.g., device wafer) comprising monolithically integrated MEM devices and integrated circuit devices. More specifically, FIGS. 1A and 1B illustrate a method for providing wafer-scale encapsulation of MEM devices according to an exemplary embodiment of the invention. As explained below, FIGS. 1A and 1B illustrate a method for sealing fine via holes (or release holes), which are used for plasma (or other vapor phase) etching to release the MEM device and to provide a local surface micromachined cavity for hermetically sealing the MEM device in a cavity containing a desired ambient. As will be explained in detail hereafter, the exemplary method comprises depositing a reflowable material around the fine via holes which are used to release an MEM device, and then reflowing the deposited material in a vacuum, or a controlled ambient, to seal the holes.

More specifically, referring to FIG. 1A, an exemplary semiconductor device (100) is shown, which comprises a substrate (101) (e.g., silicon, SOI, etc.) having active devices (102) (e.g., transistors, diodes, varactors, etc.) formed in a surface thereof, and local interconnect layers (103) connecting the active devices (102). The device (100) further comprises a plurality of metal interconnect layers (104) and inter-level vias (106) to connect active and passive devices of integrated circuits, which are formed in inter-and intra-level dielectric (ILD) layers (105) ($SiO_2$, SiN, SiON, or other organic insulators, etc.), and a final conducting layer comprising elements (107) and (108). The interconnecting wires (104), vias (106) and final conduction layer (107), (108) may be made of Al, AlCu, Cu, W, or any conductive material or combination of such materials that are commonly used in IC fabrication. It is to be understood that the number and structure of layers of, interconnecting wires (104), inter-level vias (106), and ILD layers (105) depicted in FIG. 1A is arbitrary and merely exemplary.

The semiconductor device (100) further comprises a MEM device (110) (resonator or filter) that is disposed within a cavity (109) encapsulated in one or more layers of dielectric/insulation material (112). The MEM device (110) comprises a clamped-clamped micro mechanical beam, which can act as a MEM resonator, switch, or variable capacitor, as is understood by those of ordinary skill in the art. The MEM device (110) (or resonating member) comprises a thin conducting layer (110a) (e.g., copper layer) and a thick bulk layer (110b) (dielectric material). The final conducting layer elements (108) forms an input/output electrode of the MEM device (110) and the final conducting layer elements (107) form physical anchor points for connecting the end portions of the MEM device (110) thereto. A small gap (111) is formed between the MEM device (110) and the input/output electrode element (108) to enable electrostatic actuation/de-actuation between the resonator (110) and electrode element (108).

The semiconductor device (100) further comprises a plurality of fine via holes (113) which are etched down to the cavity (109). In general, the via holes (113) are formed to enable removal of sacrificial material (not shown) within the cavity (109) and gap (111) during a plasma (or other vapor phase) etching, wherein removal of such material is performed to release the MEM device (110) and provide the local surface micromachined cavity (109) (including gap (111)) for subsequently hermetically sealing the active MEM device (110) within the cavity (109) having a desired ambient.

The semiconductor device (100) may be fabricated using the methods described in U.S. patent application Ser. No. 10/316,254 filed on Dec. 10, 2002, entitled "Low Temperature Bi-CMOS Compatible Process for MEMs RF Resonators and Filters", which is commonly assigned and incorporated herein by reference. This application describes various methods for forming a MEM resonator or filter which is compatible with integration with any analog, digital; or mixed-signal integrated circuit process, as well as vacuum encapsulation methods for sealing the cavity with vacuum coating processes. The methods enable construction of MEM devices at temperatures low enough to be compatible with the metal interconnect levels of any analog, digital, or mixed signal integrated circuit process. Moreover, methods are provided for releasing the freestanding portions of the MEM devices from the surrounding substrate and materials in a manner which is compatible with the metal interconnect levels of any analog, digital, or mixed signal integrated circuit process, which eliminates stiction during processing, and which allows for the construction of ultra-small gaps between electrodes of the MEM devices.

Briefly, one exemplary encapsulation method described in the above-incorporated patent application comprises forming the cavity (109) in a dielectric layer material, filling the cavity with a sacrificial material (e.g., carbon-based material) that is readily removable without significant etching of the material surrounding the cavity (109), capping the cavity (109) with the dielectric material (112), which is formed of a material that is not readily removed when removing the sacrificial material surrounding the MEM device (110) inside the cavity, patterning the fine via holes (113) in the capping layer (112), removing the sacrificial material within the cavity (109) (and gap (111)) through the via holes (113) in the capping material (112), and sealing the cavity (109) with a vacuum coating process such as PECVD (plasma enhanced chemical vapor deposition) or PVD (physical vapor deposition). With such method, the release vias (113) are "pinched-off" by a CVD oxide deposition.

In the exemplary embodiment of FIGS. 1A and 1B, an encapsulation process is implemented which enables pinch-off, of the fine via holes (113) and thus hermetic sealing of the MEM device (110) within the cavity (108) under desired ambient conditions which are not determined by the sealing process, and which prevents material from being inadvertently deposited on the active MEM device (110) during the pinch-off sealing process.

More specifically, referring to FIG. 1A, a reflowable material (114) is deposited on the capping layer (112) around the via holes (113) used to release the MEM device (110). FIG. 1B depicts the exemplary semiconductor device (100) of FIG. 1A after a reflow process in which the material (114) is subsequently reflowed in vacuum, or a controlled ambient, to seal the holes (113). When the reflowable sealing material (114) is in a liquid state, the material will flow and bridge or fill the holes (113) to minimize surface tension. With the exemplary process depicted in FIGS. 1A and 1B, the reflowable sealing material (114) is deposited on the capping layer (112) in proximity to the via holes (113) but does not block the via holes (113) prior to reflow. In this manner, the cavity (108) in which the MEM device (110) resides can be evacuated or filled with a desired (non-oxidizing) ambient prior to, and during, the reflow process.

By way of example, the cavity (109) can be evacuated by loading the device wafer (100) into a processing chamber equipped with a vacuum pump, and pumping down the chamber and the wafer (100) to the desired pressure level. Further, if desired, the chamber can be back filled with an inert gas. More specifically, in one exemplary embodiment, when the device wafer (100) is loaded into the processing chamber to be evacuated, the device wafer (100) is mounted on a heating chuck. The device wafer (100) may be mechanically clamped around the edges of the chuck with backside He provided to make sure that the device wafer (100) is in good thermal contact with the heating chuck. Alternatively, heat lamps may be used to heat the device wafer (100) to the desired temperature. Moreover, the sealing material (114) should melt at a temperature of about 400 degrees C. or less, or at a temperature low enough that the wiring levels on the device wafer (100) are not damaged. The amount of sealing material (114) used should be adequate to fully close-off all of the via holes (113), but it is not necessary to fully fill the via holes (113).

In accordance with exemplary embodiments of the invention, the sealing material (114) may include solders, low melting point metals, glass frits, or thermal plastic materials or polymers. With solders, or low melting point metals, a wettable coating may be applied on the capping layer (112) to enable/promote adhesion and sealing the holes (113). For example, in one exemplary embodiment of the invention, the sealing material (114) may be a lead rich Pb-Sn solder, which is similar to that material which is used for C4 micro solder balls to electrically connect a chip to a package substrate. In such instance, the solder material could be deposited by evaporation though a metal mask at the same time as the C4 solder balls and underlying ball limiting metallurgy (BLM) layers are deposited. The BLM layers provide an adhesion layer and a metallurgy which the solder "wets". Moreover the size of the via holes (113) could be adjusted so that when the BLM layers and solder is evaporated, the via holes (113) are not closed off but remain open, since the evaporation is directional (i.e. line of site). The holes (113) should not be aligned with an active portion of the MEM device to avoid depositing material on it, which as described above, could adversely affect the performance. The sealing material (114) could then be melted in the desired ambient, as described above, to seal the holes (113). This process would also serve to reflow the C4 solder balls, which is typically done prior to joining a chip to a package. Note that when the chip is mounted to the package and the C4 solder balls are reflowed, even though the sealing material (114) will be melted again, the surface tension in the small via holes (113) will keep the sealing material in place until it is resolidified.

In other exemplary embodiments, an additional capping layer may be formed over the device for increased hermetic sealing. For example, when a thermal plastic material is used as the reflowable sealing material (114), such material should be coated over with an impervious layer to provide a hermetic seal. Suitable materials for such additional capping layers include both inorganic insulating layers such as $SiO_2$ or $SiN_x$ or metallic layers such as Al or other metals. In one exemplary embodiment, the additional capping layer is formed to have a thickness of about 0.5 microns, or any other thickness which is sufficient to form a hermetic seal for the given application.

Figure 2A:
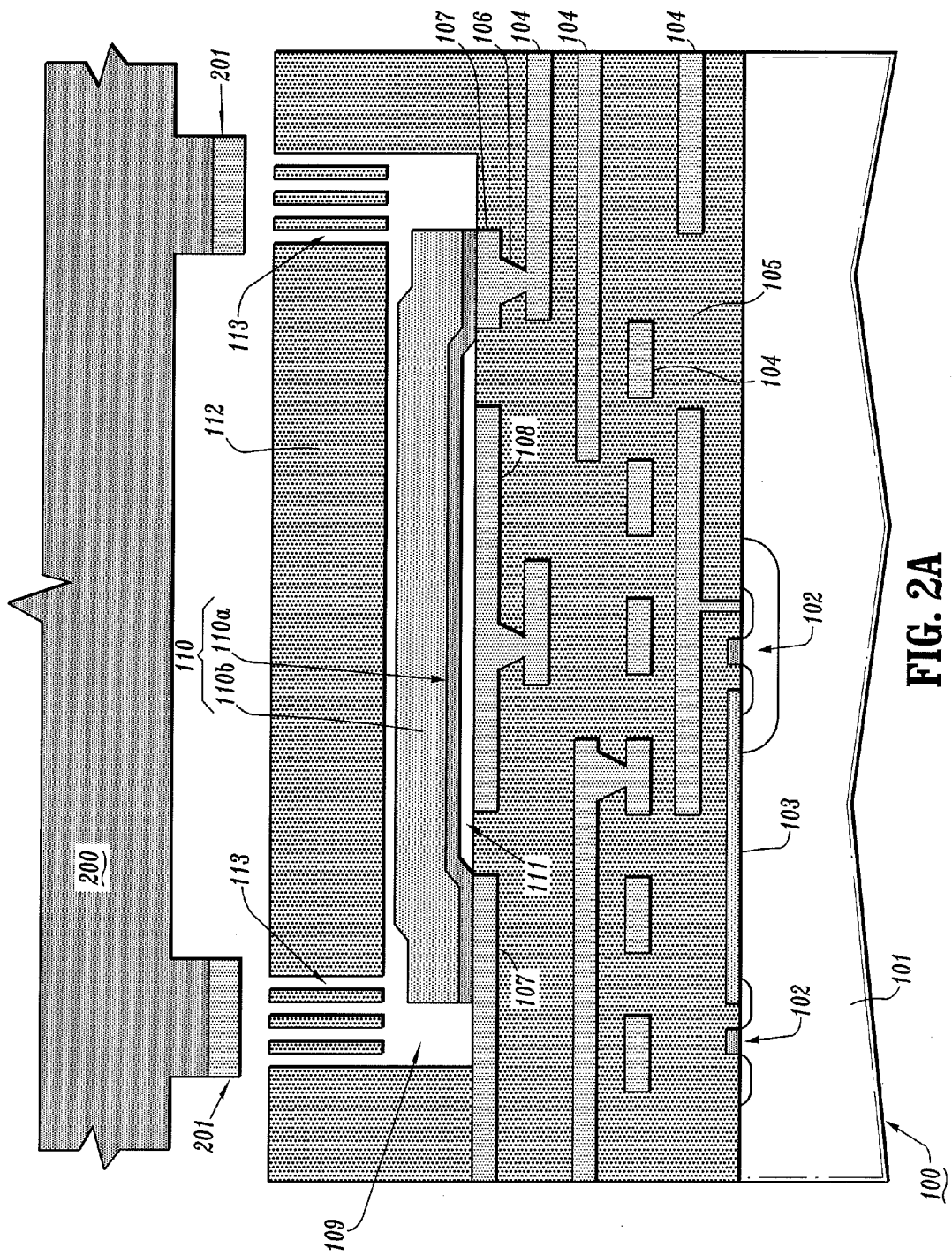
FIGS. 2A and 2B are schematic cross-sectional views of an MEM device, which illustrate a method for wafer-scale encapsulation of the MEM device according to another exemplary embodiment of the invention.
Figure 2B:
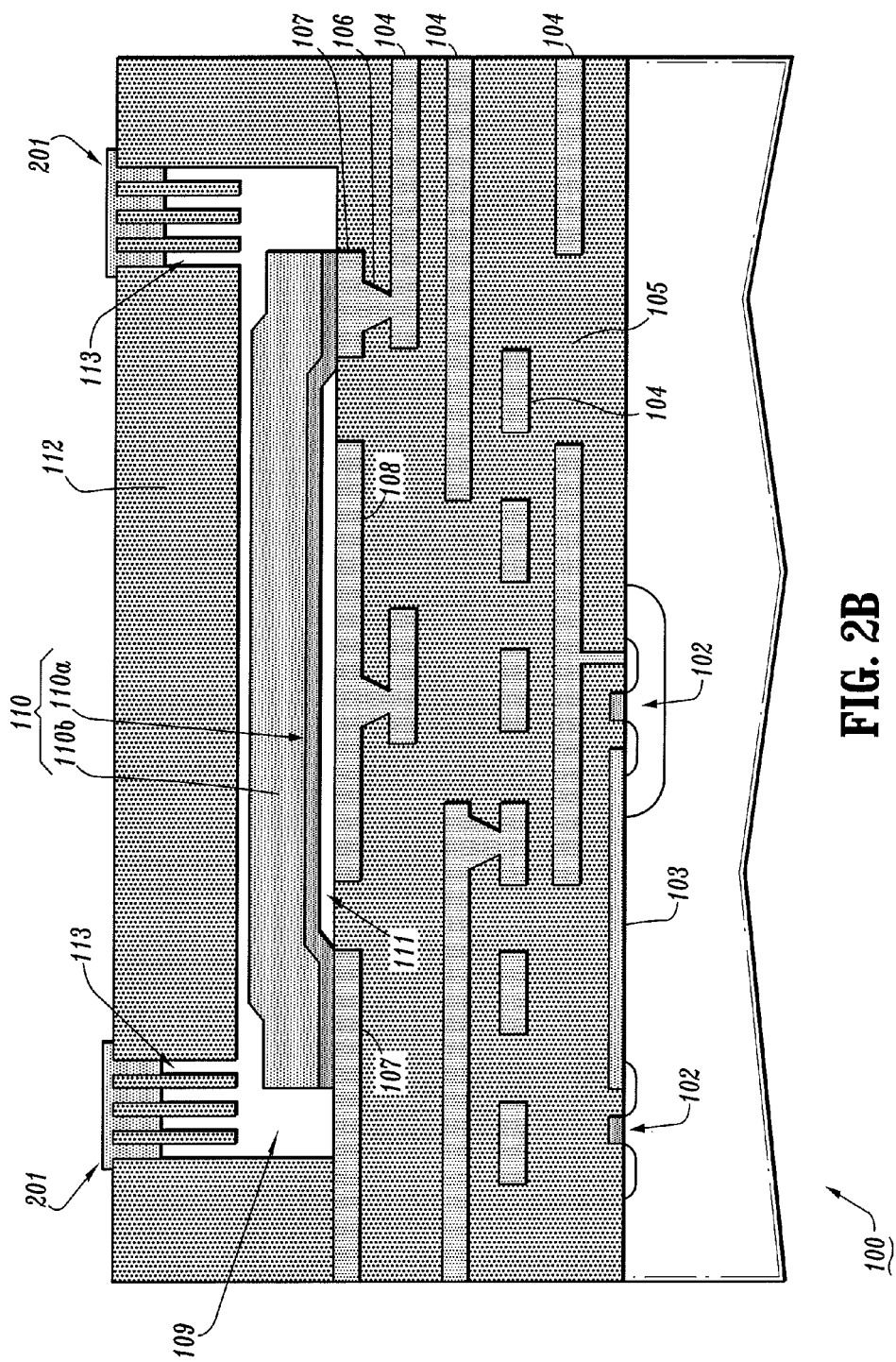

FIGS. 2A and 2B are schematic cross-sectional views of the semiconductor device (100) discussed above, but illustrating a method for providing wafer-scale encapsulation of MEM devices according to another exemplary embodiment of the invention. In general, with the exemplary method depicted in FIGS. 2A and 2B, the reflowable sealing material is dispensed or transferred to the device wafer (100) to seal the via holes (113) and encapsulate the MEM device in the desired ambient, e.g. vacuum, etc. More specifically, in the exemplary embodiment of FIG. 2A, a carrier wafer (200) is shown having protruding portions with sealing material (201) attached thereto. During an encapsulation process, the carrier substrate (200) is aligned with the semiconductor device (100) (e.g., wafer) such that the reflowable sealing material (201) is aligned with the via holes (113). The reflowable sealing material (201) is then transferred from the carrier substrate (200) to the semiconductor device wafer (100) to seal the via holes (113), such as depicted in FIG. 2B.

In this exemplary embodiment, the sealing material (201) may include solders, low melting point metals, glass frits, or thermal plastic materials or polymers. In the case of solder or a glass frits, the carrier wafer (200) could be aligned to the semiconductor device wafer (100), and brought in contact with the device wafer (100). One or both of the wafers (100) and/or (200) can be heated prior to being brought into contact, or the wafers (100) and (200) can be heated after they are contacted to melt the material (201) and seal the via holes (113).

In one exemplary embodiment, the carrier substrate (200) is coated with a material which the sealing material (201) does not "wet" well, to aid in transferring the sealing material (201). For example, an oxide layer can used on the carrier substrate (200) when the sealing material (201) is solder. Indeed, since solder does not "wet" the oxide layer well, less solder will be left on the carrier substrate (200).

In another exemplary embodiment of the invention, rather than having separate regions of sealing material on the carrier wafer which are aligned to the via holes (113) (as depicted in FIG. 2A), the carrier wafer (200) can have a continuous layer of sealing material (201) formed over the surface which is mated to the device wafer (100). This process avoids critical issues of alignment. As with the exemplary methods described above, the transfer of the sealing material is performed in a controlled ambient. With this method, the sealing material is deposited over the entire surface of the insulating layer (112), sealing all the via holes (113). Thereafter, the transferred sealing material on the insulating layer (112) can be patterned using conventional lithographic means to allow electrical contacts to be made to the chip.

Although exemplary embodiments have been described herein with reference to the accompanying drawings, it is to be understood that the invention is not limited to these exemplary embodiments, and that various other changes and modifications may be envisioned by one of ordinary skill the in the art without departing from the scope or spirit of the invention. All such changes and modifications are intended to be included within the scope of the invention as defined by the appended claims.

What is claimed is:

1. A semiconductor device, comprising:
    a semiconductor substrate having active devices formed in an active surface of the semiconductor substrate;
    an interconnect structure formed on the active surface of the semiconductor substrate, wherein the interconnect structure comprises one or more layers of dielectric material encapsulating one or more metallization levels;
    an integrated microelectromechanical (MEM) device disposed within a cavity formed in the dielectric material;
    a plurality of via holes that extend from a surface of the semiconductor device through the dielectric material to the cavity; and
    reflowable material sealing the via holes.

2. The semiconductor device of claim 1, wherein the reflowable material comprises solder.

3. The semiconductor of claim 2, wherein the solder is the same solder used to form electrical interconnects between a chip and a package substrate.

4. The semiconductor device of claim 1, wherein the reflowable material comprises a metal with a melting point about 400 degrees C. or less.

5. The semiconductor device of claim 1, wherein the cavity is sealed in a vacuum state.

6. The semiconductor device of claim 1, further comprising a capping layer formed over the sealed via holes.

7. A method for sealing a microelectromechanical (MEM) device, comprising:
    forming a semiconductor device wafer having an MEM device and intergrated circuit components monolithically formed on an active side of the semiconductor device wafer, wherein the MEM device is disposed within a cavity formed below a surface of the active side of the semiconductor device wafer, and a plurality of via holes extending from the active side surface of the semiconductor device wafer to the cavity; and sealing the via holes under controlled ambient conditions within the cavity, wherein sealing is performed under conditions that are independent of the deposition conditions of the sealing material.

8. The method of claim 7, wherein sealing the via holes comprises:

depositing a reflowable sealing material on the active side surface of the semiconductor device wafer in proximity to the via holes;

placing the semiconductor device wafer in an environment with the controlled ambient conditions; and melting the reflowable sealing material to seal the via holes while the semiconductor device wafer is subjected to the controlled ambient conditions.

9. The method of claim 8, wherein the reflowable material comprises solder.

10. The method of claim 9, wherein the solder is the same solder used to form electrical interconnects such as C4 solder balls between a chip and a package substrate.

11. The method of claim 10, wherein melting the reflowable sealing material to seal the via holes is performed concurrently with reflowing the C4 solder balls.

12. The method of claim 8, wherein the reflowable material comprises a metal with a melting point of about 400 degrees C. or less.

13. The method of claim 8, further comprising forming a capping layer over the sealed via holes to provide increased hermetic sealing of the MEM device in the cavity.

* * * * *